(12) United States Patent
Dames et al.

(10) Patent No.: US 8,890,509 B2
(45) Date of Patent: Nov. 18, 2014

(54) CURRENT SENSOR

(75) Inventors: Andrew Dames, Cambridge (GB);
Matthew Storkey, Cambridge (GB);
Edward Colby, Cambridge (GB);
Oliver Burstall, Huntingdon (GB)

(73) Assignee: Sentec Ltd., Cambridge (GB)

( * ) Notice: Subject to any disclaimer, the term of this patent is extended or adjusted under 35 U.S.C. 154(b) by 298 days.

(21) Appl. No.: 13/390,291

(22) PCT Filed: Aug. 16, 2010

(86) PCT No.: PCT/EP2010/061914
§ 371 (c)(1),
(2), (4) Date: Feb. 14, 2012

(87) PCT Pub. No.: WO2011/018530
PCT Pub. Date: Feb. 17, 2011

(65) Prior Publication Data
US 2012/0146620 A1    Jun. 14, 2012

(30) Foreign Application Priority Data

Aug. 14, 2009 (GB) .................................. 0914259.7

(51) Int. Cl.
*G01R 15/20* (2006.01)
*G01R 15/18* (2006.01)
(52) U.S. Cl.
CPC .................................. *G01R 15/181* (2013.01)
USPC ................... 324/117 H; 324/126; 324/117 R; 324/76.11
(58) Field of Classification Search
CPC .... G01R 15/181; G01R 15/20; G01R 15/202; G01R 33/02; G01R 15/18
USPC ........................................... 324/117 R, 117 H
See application file for complete search history.

(56) References Cited

U.S. PATENT DOCUMENTS 5,652,506 A   7/1997  Sorenson et al.
5,717,326 A   2/1998  Moriwaki
(Continued)

FOREIGN PATENT DOCUMENTS

EP   1 855 118    11/2007
IE   20010370    10/2001
(Continued)

OTHER PUBLICATIONS

Search Report and Written Opinion mailed on Jan. 24, 2011 for International Application No. PCT/EP2010/061914. 13 Pages.

(Continued)

*Primary Examiner* — Melissa Koval
*Assistant Examiner* — Courtney McDonnough
(74) *Attorney, Agent, or Firm* — Knobbe, Martens, Olson & Bear, LLP

(57) ABSTRACT

A sensor for use in detecting a time-varying current in a conductor (106) comprises plural sets of two oppositely-configured sensor elements (104-1 . . . 104-6) arranged around a sensing volume having a central axis, the sensor elements (104-1A, 104-1B) of each set being provided substantially in a common plane that does not intersect the central axis, and each set having a different common plane, the sensor elements of each set being arranged such that a normal (N) of their common plane at a point between central parts of sensor elements lies on a plane (P) that is radial to the central axis of the sensing volume.

8 Claims, 8 Drawing Sheets

(56) References Cited

U.S. PATENT DOCUMENTS

| | | | |
|---|---|---|---|
| 6,965,225 B2 * | 11/2005 | de Buda | 324/117 R |
| 7,227,348 B2 * | 6/2007 | Sorensen | 324/126 |
| 2002/0047701 A1 * | 4/2002 | Kawase | 324/117 R |
| 2003/0112000 A1 * | 6/2003 | Sorenson, Jr. | 324/126 |
| 2003/0160603 A1 | 8/2003 | Kojovic | |
| 2004/0257061 A1 * | 12/2004 | George de Buda | 324/117 R |
| 2012/0139534 A1 | 6/2012 | Storkey et al. | |

FOREIGN PATENT DOCUMENTS

| | | |
|---|---|---|
| JP | 10-213617 | 8/1998 |
| JP | 2005-249677 | 9/2005 |
| JP | 2006-322706 | 11/2006 |
| JP | 2007 107972 | 4/2007 |
| JP | 2007107972 A * | 4/2007 |
| WO | WO 2004-086063 | 10/2004 |
| WO | WO 2007/068221 | 6/2007 |
| WO | WO 2009-009878 | 1/2009 |
| WO | WO 2009-021076 | 2/2009 |

OTHER PUBLICATIONS

Search Report and Written Opinion mailed on Jan. 26, 2011, for International Application No. PCT/EP2010/061917. 36 pages.

International Preliminary Report on Patentability mailed on Jan. 10, 2012 for International Application No. PCT/EP2010/061917. 10 Pages.

International Preliminary Report on Patentability mailed on Nov. 16, 2011 for International Application No. PCT/EP2010/061914. 14 Pages.

Japanese Office Action dated Mar. 10, 2014 with English Translation, for Japanese Patent Application No. 2012-524250, 5 pages.

* cited by examiner

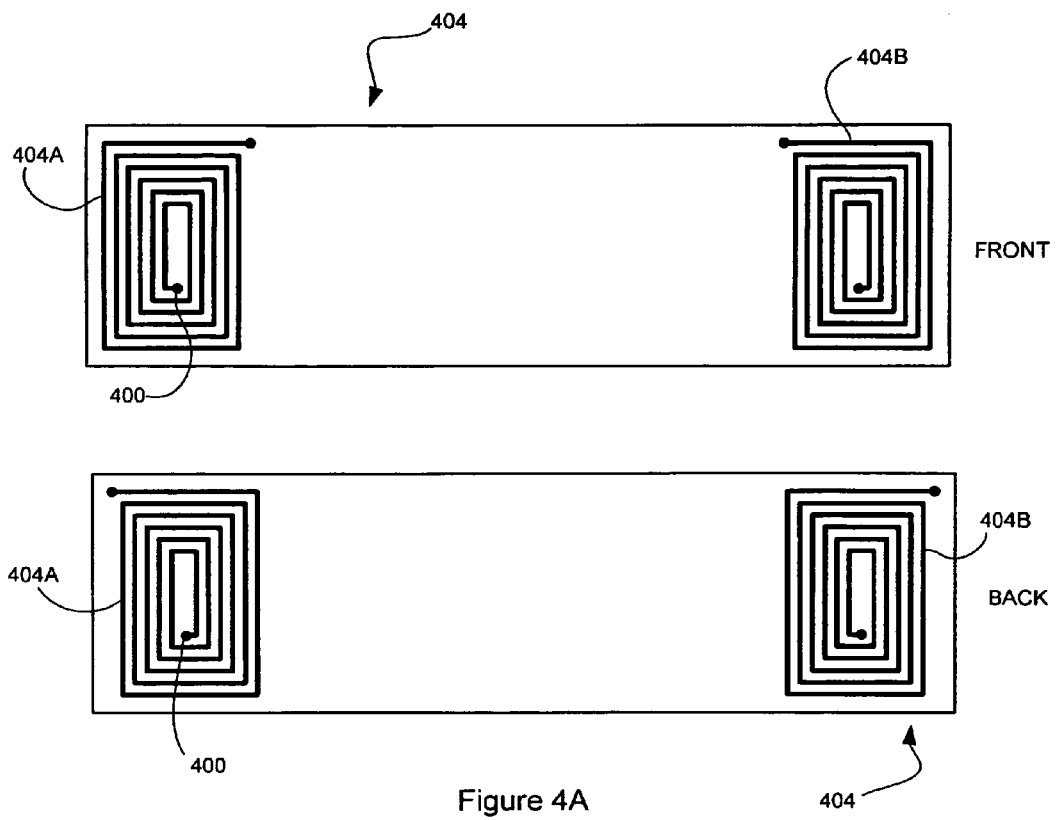
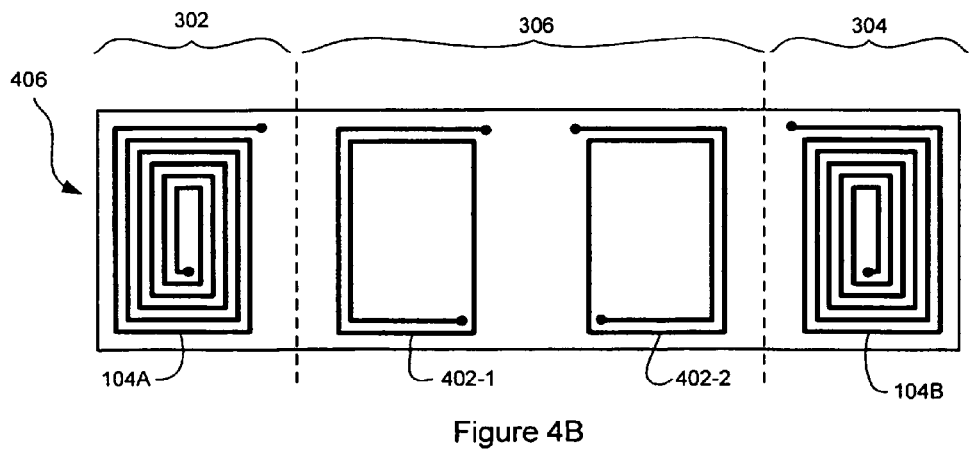
Figure 4A
Figure 4B

CURRENT SENSOR

REFERENCE TO RELATED APPLICATIONS

This application is the U.S. National Phase of International Application PCT/EP2010/061914, filed Aug. 16, 2010, and claims priority to United Kingdom Patent Application No. 0914259.7, filed Aug. 14, 2009. Each of the priority applications is hereby incorporated by reference in its entirety.

FIELD OF THE INVENTION

This invention relates to a sensor for use in detecting a time-varying current in a conductor.

BACKGROUND

In the field of electrical distribution, it is useful to be able to measure current flowing through conductors. Often these conductors are operated at high electric potential relative to ground and thus it is advantageous to make the measurement without direct electrical connection.

It is possible to make such measurements using a current transformer. Such a device uses a magnetic circuit to couple the current in the conductor to be measured (primary conductor) and the current in a secondary conductor. This magnetic circuit typically consists of a yoke of ferromagnetic material having a conductive coil (the secondary conductor) wound therearound.

There are a number of drawbacks to this kind of current sensor. The magnetic circuit may saturate either as a result of impedance in the secondary circuit, the presence of a non-time varying current in the primary conductor, or the presence of an externally imposed magnetic field. Any of these conditions results in the current sensor losing accuracy. Furthermore, hysteresis in the magnetic circuit leads to non-linear sensor response at low operating current.

Most modern current sensors can be constructed using surface coils uniformly spaced around a central cavity through which the primary conductor passes. These are known as Rogowski sensors. Rogowski sensors include an air core, rather than a magnetic core. Surface coils include one or more turns of a conductor provided on a substrate, for example by etching or using printed circuit board technology. In order to obtain a good rejection of magnetic fields that are not due to the primary conductor, the surface coils are very precisely aligned on axes radial to a central axis of cavity through which the primary conductor passes. Such a sensor is described in U.S. Pat. No. 6,965,225 B2.

SUMMARY OF INVENTION

A first aspect of the invention provides a sensor for use in detecting a time-varying current in a conductor, the sensor comprising plural sets of two oppositely-configured sensor elements arranged around a sensing volume having a central axis, a plane of zero sensitivity to uniform magnetic fields of the sensor elements of each set being provided substantially in a common plane that does not intersect the central axis, and each set having a different common plane, the sensor elements of each set being arranged such that a normal of their common plane at a point between central parts of sensor elements lies on a plane that is radial to the central axis of the sensing volume.

This can result in the desirable effect of the responses of the oppositely-configured sensor elements can be cancellation of far fields whilst providing summation of a circulating field originating at the conductor. Moreover, sensors constructed in accordance with the invention can offer rejection of external magnetic fields at least as good as quadrupole element based sensors whilst producing signal levels comparable with dipole based sensors.

The present invention provides a sensor arrangement which can be simpler and cheaper to manufacture. This is, at least in part, because sensor elements such as coils, which require precise planar alignment, are able to be provided on a single planar substrate and thus inherently aligned in the same plane. Also, the sensor arrangement can be constructed with fewer substrates for a given number of coils, which potentially contributes to a simplified construction and reduced manufacturing costs.

Including a regular arrangement of sensor elements can provide higher order rejection to interfering fields, and produce nulls in the sensor response that can be arranged to coincide with the locations of specific conductors for which it maybe desirable that the sensor has no response whatsoever, for example conductors of other phases in a polyphase supply.

The sensitivity of an arrangement in accordance with the invention can be made to be largely uniform within the area enclosed by the substrates. In addition, the inclusion of additional sensor elements on a substrate can further improve the uniformity of the response within the sensor.

As will be seen from the below explanation, in the embodiments the sensor elements of each set are oppositely configured such that signals induced by a uniform magnetic field passing through the sensor elements of the set have an opposite sign and such that signals induced by a circulating magnetic field due to a current passing through a conductor provided in the sensing volume have the same sign. Also, the signals induced by the uniform magnetic field in the sensor elements of each set have a first magnitude and the wherein the signals induced by the circulating field in the sensor elements of each set have a second magnitude.

Each of the oppositely-configured sensor elements in each common plane may be provided on a respective common substrate. Alternatively, the oppositely-configured sensor elements may be supported on respective substrates, or may be supported in place by some other suitable means.

BRIEF DESCRIPTION OF THE DRAWINGS

Embodiments of the invention will now be described, by way of example, with reference to the accompanying drawings, in which:

FIGS. 4A and 4B depict sets of two oppositely-configured sensor elements which may be used in alternative embodiments of the invention;

DETAILED DESCRIPTION OF THE EMBODIMENTS

Figure 1:
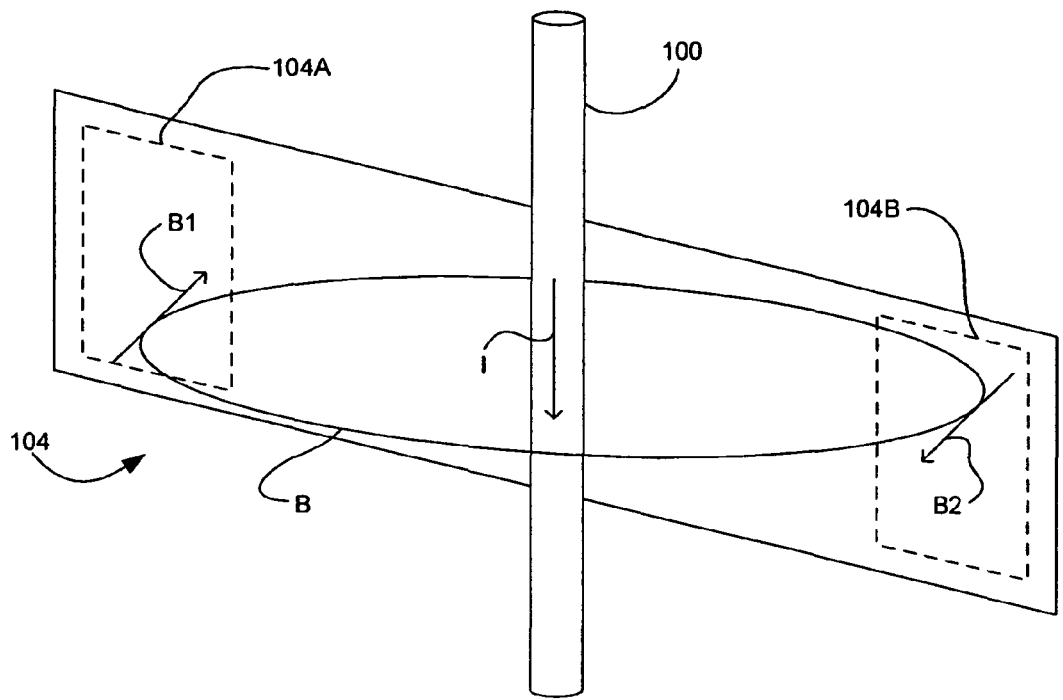
FIG. 1 is a schematic diagram illustrating principles by which the invention operates.

In the drawings and the below-described embodiments, like reference numerals refer to like elements.

FIG. 1 depicts a primary conductor 100, a circulating magnetic field B resulting from a current I flowing through the primary conductor 10 and a schematic view of a set of two oppositely-configured sensor elements 104 of which the invention is comprised.

In FIG. 1, a current is flowing through the primary conductor 100 in a downwards direction, as denoted by the arrow labelled I. Current moving through the primary conductor 100 results in a circular magnetic field loop B surrounding the primary conductor 100. The direction of the magnetic field at particular positions on the loop B are denoted by the arrows B1 and B2.

The sensor elements 104A, 104B of the set of sensor elements 104 are configured such that when a uniform field, such as due to a distant current carrying conductor (not shown), passes through the sensor elements 104A, 104B, equal and opposite signals are produced by induction in each of the sensor elements 104A, 104B. As such, the sum of the signals generated by the set of oppositely-configured sensor elements 104 due to a uniform field is zero. The magnetic field loop B due to the primary conductor B, however, passes through a first of the sensor elements 104A in a first direction B1 and through a second of the sensor elements 104B in a second, opposite direction. Thus, instead of cancelling (as was the case with signals induced due to a uniform magnetic field), the signals induced in the set of oppositely-configured sensor elements 104 sum positively. It will thus be understood that the set of two oppositely-configured sensor elements 104 is arranged such that the signals due to a uniform magnetic field passing through each of the pair of sensor elements 104A, 104B cancel and that signals induced by the magnetic field loop due to the primary conductor 100 in each of the sensor elements 104A, 104B are equal and of the same sign (and thus sum positively).

Figure 2:
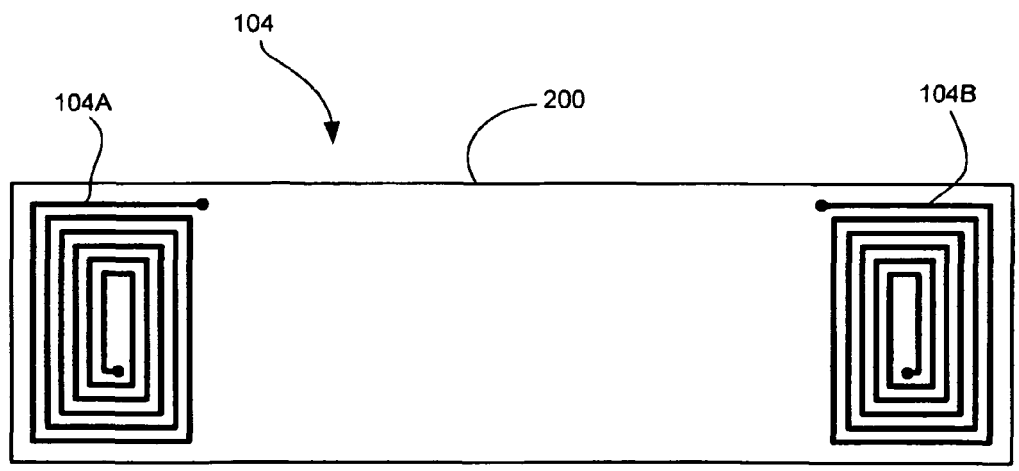
FIG. 2 depicts an example of a set of two oppositely-configured sensor elements of which embodiments of the invention are comprised.

FIG. 2 shows a set of oppositely-configured sensor elements 104 of which some embodiments of the invention are comprised.

The two sensor elements 104A, 104B of the set 104 are provided substantially in a common plane. In this example, the sensor elements 104A, 104B are provided on a surface of a planar substrate 200. The sensor elements 104A, 104B each consist of one or more turns of a conductor. In this example, the sensor elements 104A, 104B consist of plural turns of a conductor provided on the surface of the substrate 200. The sensor elements 104A, 104B have a plane of zero sensitivity to uniform magnetic fields is coincident with the plane of the substrate 200a The sensor elements 104A, 104B, which may also be termed dipole coils, are oppositely-configured by virtue of the direction in which the one or more turns are wound. For example, in FIG. 2, the first sensor element winds from the centre outwards in a clockwise direction. Conversely, the second sensor element winds from the centre outwards in an anticlockwise direction. A set of two oppositely configured sensor elements 104 may also be termed a quadrupole coil set. The terms dipole and quadrupole refer to the magnetic arrangement that arises from the coils.

Figure 3:
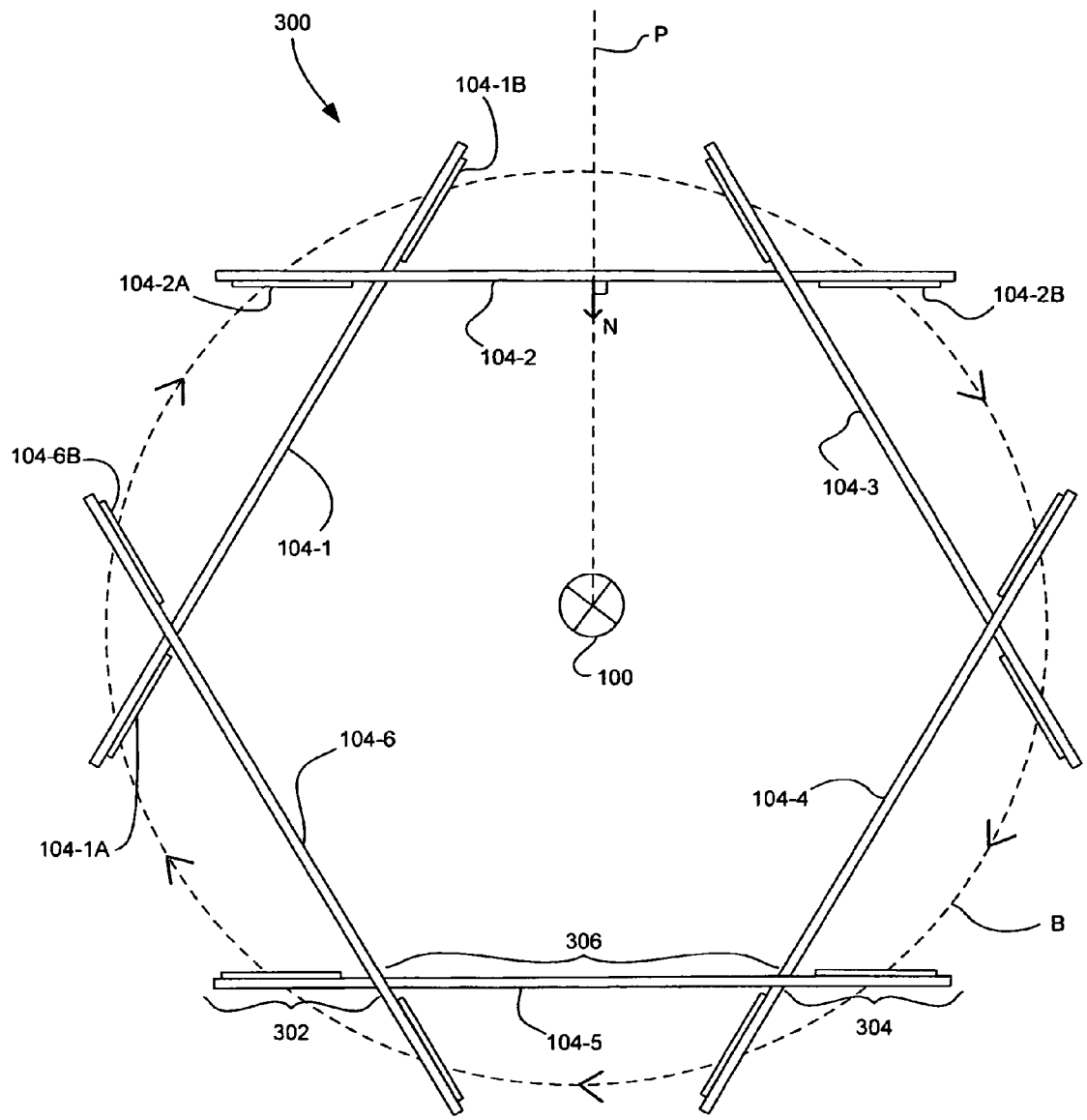
FIG. 3 is a schematic view of a sensor arrangement according to a first embodiment of the invention.

FIG. 3 shows a sensor arrangement 300 of plural sets of two oppositely-configured sensor elements 104-1 to 104-6 according to a first embodiment of the invention. Each set of two oppositely-configured sensor elements 104 is provided on a planar substrate (not labelled in the Figure) and may be referred to as a sensor board (also labelled 104-1 to 104-6). Each sensor elements 104 has a plane of zero sensitivity to uniform magnetic fields that is coincident with the plane of its sensor board 104-1 to 104-6.

The sensor arrangement 300 according to the first embodiment of the invention comprises six sensor boards 104-1 to 104-6. The Figure also shows the primary conductor 100, which in this example has a current flowing through it in a direction into the page. Also shown is the circular magnetic field loop (the direction of the field being denoted by arrows around the circle) due to the current flowing through the primary conductor 100.

The plural sensor boards 104-1 to 104-6 are arranged around the primary conductor 104. The sensor boards 104-1 to 104-6 are arranged such that a volume V is encapsulated by the sensor boards 104-1 to 104-6 around the primary conductor 100. Each of the sensor boards 104-1 to 104-6 is arranged such that a normal N to the plane in which a set of oppositely-configured sensor elements 104 lies (i.e. the plane of the surface of the substrate on which the sensor elements 104A, 104B are provided) at a point on the plane between two oppositely configured sensor elements (for example, sensor elements 104-2A and 104-2B) lies on a plane P that passes through a central point of the volume V encapsulated by the sensor boards. Optimally, the sensor elements (for example sensor elements 104-2A and 104-2B) are symmetric about the normal N to the plane of the sensor elements which lies in the plane P radial to the central point of the volume V.

Each of the sensor boards 104-1 to 104-6 overlaps at each end with one of the other sensor boards 104-1 to 104-6 such that each sensor board 104 comprises two end portions 302, 304, which extend beyond the respective overlapping other sensor boards 104, and a middle portion 306 extending between the two end portions 302, 304. In this example, the sensor elements 104-1A, 104-1B etc are provided on the end portions 302, 304 of the sensor boards 104.

The sensor boards 104 are arranged such that signals due to the circular magnetic field in each of the sensor elements 104-1A, 104-1B etc sums positively. Each of the sensor elements 104-1A, 104-1B is connected in series with an adjacent sensor element. As such, a first sensor element 104-1A of a first sensor board is connected in series with a second sensor element 104-6B of a sixth of the sensor boards 104-6 which is then connected in series to a first sensor element 104-2A of a second sensor board 104-2 and so on.

The sensor elements 104-1A, 104-1B etc may be connected using printed tracks on a rigid or flexible circuit board or by using twisted pair wiring. Alternatively, the sensor elements 104-1A, 104-1B etc may be connected in parallel, although in such embodiments the sensor elements 104-1A, 104-1B etc require matched resistances.

The sensor boards 104 optimally are arranged such that a cross-section of the volume surrounded by the sensor boards is of a regular polygonal shape, in this embodiment, a hexagon.

FIGS. 4A and 4B show alternative sensor boards that may be used to form embodiments of the invention.

FIG. 4A shows a front and a back respectively of a first alternative sensor board 404. Turns of conductive material are provided on each side of the sensor board 404. The turns of conductive material at each end of the sensor board are connected by a via 400 passing through the substrate 408 of the sensor board. The turns are arranged such that the signal due to a magnetic field passing through the turns provided at a first end of the front of the sensor board sums positively with the turns provided on the first end of the back surface of the sensor board. Thus, in this example a single sensor element 404A, 404B comprises the turns on both the front and the back of the sensor board 404. The provision of turns of conducting material on both sides of the sensor board increases the sensitivity of the sensor element 404A, 404B to a circular magnetic field.

FIG. 4B shows a second alternative sensor board 406. In this example, the sensor board 406 includes the oppositely-configured primary sensor elements 104A, 104B (as described with reference to FIG. 2) and also a set of two oppositely-configured additional sensor elements 402. The additional sensor elements 402 have an effect of improving the uniformity of the response within the sensor arrangement. The additional sensor elements 402-1, 402-2 are provided on a middle portion 306 of the sensor board 406. The additional sensor elements 402-1, 402-2 also comprise one or more turns of conductive material and are oppositely-configured by virtue of their direction of winding. The additional sensor elements 402-1, 402-2 have a plane of zero sensitivity to uniform magnetic fields that is coincident with the plane of their sensor board 406.

It will be understood that, according to some examples, the sensor boards may comprise more that one set of two oppositely-configured additional sensor elements. Also, it will be appreciated that the primary sensor elements 104A, 104B and the additional sensor elements 402-1, 402-2 of the sensor board of FIG. 4B may also include turns of conductive material on the opposite surface of the sensor board, such as is described with reference to FIG. 4A.

The sensor boards may be multi-layer circuit boards incorporating electrostatic shielding layers. A shielding layer protects the sensor elements from electrostatic pickup from the voltage on the conductor, when measuring the current in the conductor.

The sensor elements may be fabricated using any means of producing coplanar circuit elements such as printed circuit board technology, integrated circuit fabrication, thick film techniques and screen printing. Alternatively, the sensor elements may printed on ceramic or glass or may comprise pre-wound turns of conductive material held in place on a former or embedded in a moulding.

Figure 5A:
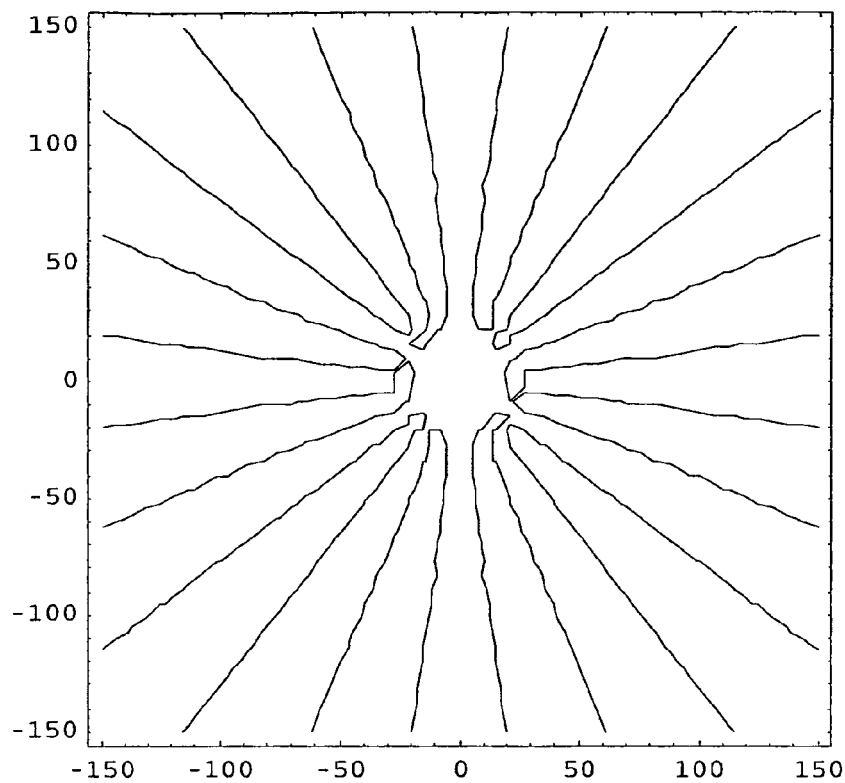
FIG. 5A shows a far-field sensitivity pattern of a sensor according to the first embodiment of the invention.

FIG. 5A shows a far-field sensitivity pattern from a sensor arrangement comprised of the sensor boards 406 described with reference to FIG. 4B and arranged according to the first embodiment as described with reference to FIG. 3. Each of the lines on FIG. 5A shows positions of zero sensitivity to far magnetic fields around the sensor arrangement 300. The far-field rejection is a function of the order of symmetry of the arrangement of the sensor elements. The sensor arrangement of FIG. 3, which includes six boards and therefore 12 sensor elements, produces a far-field sensitivity pattern having 24 null response directions. An arrangement comprised of four sensor boards arranged in a square provides a far-field rejection pattern exhibiting 16 null response directions. A sensor arrangement made up of three sensor boards arranged in a triangle produces a far-field sensitivity pattern including 12 null response directions.

Figure 5C:
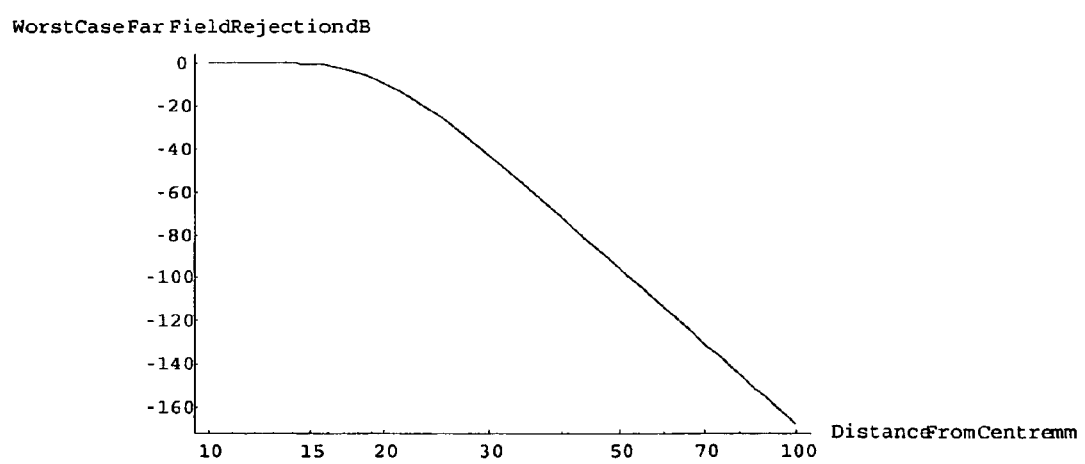
FIG. 5C shows the rejection of sensitivity to an interfering conductor as a function of distance of a sensor according to the first embodiment.
Figure 5B:
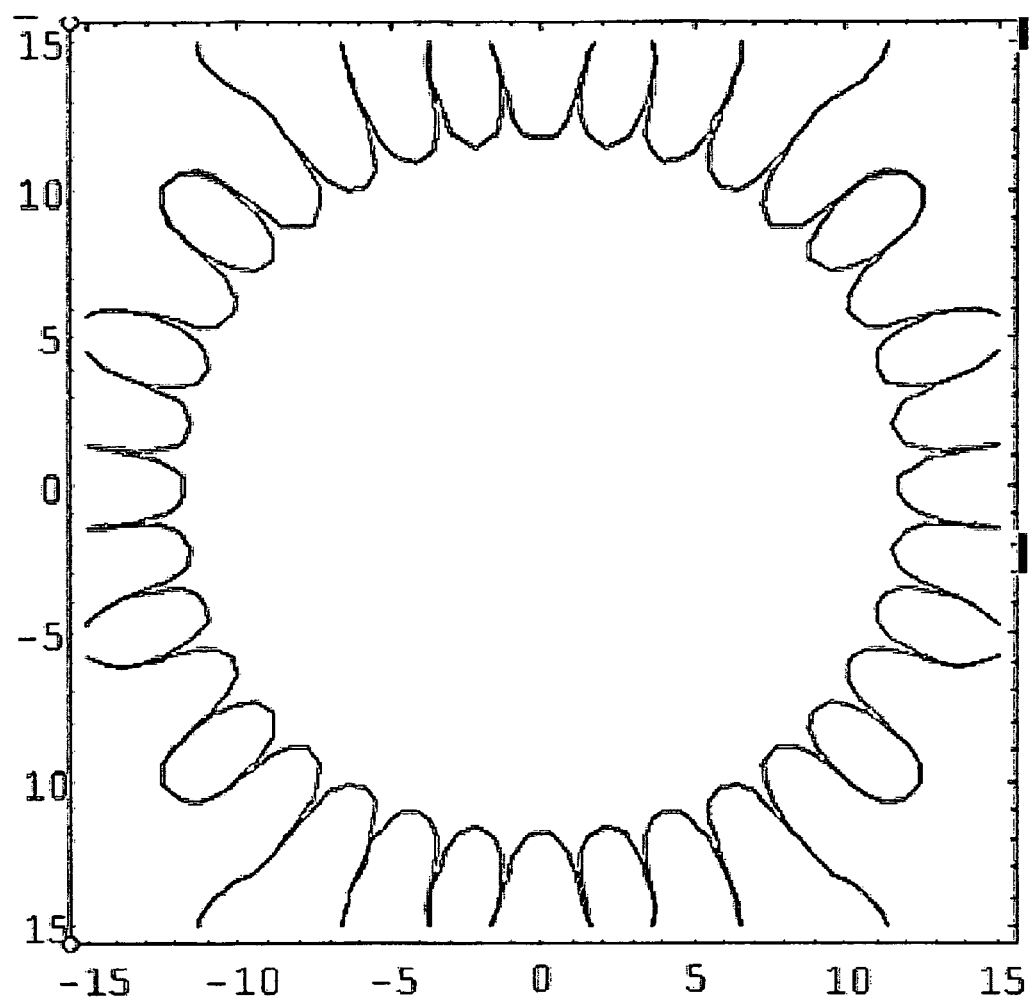
FIG. 5B shows a pattern of uniformity within a sensor according to the first embodiment of the invention.

FIG. 5B shows the pattern of uniformity within a sensor arrangement having six sensor boards 406 such as that shown in FIG. 4B which are arranged according to the first embodiment described with reference to FIG. 3. The lines on the Figure show the positions of a 0.1% deviation in sensitivity. An arrangement of six sensor boards, which has six sets of oppositely-configured sensor elements 104A, 104B (i.e. resulting in six quadrupoles) has at best 12 radial planes of uniform sensitivity to current flowing within the volume surrounded by the sensor boards. The provision of additional sensor elements 402-1, 402-2 on the sensor boards 406 improves the uniformity of the response within the sensor arrangement. For example, introducing onto each sensor board two oppositely-configured additional sensor elements 402-1, 402-2 (i.e. one additional quadrupole) increases the number of planes of uniform sensitivity by a factor of three. Thus, as can be seen in FIG. 5B, six sensor boards each having a set of primary sensor elements 104 results in 12 planes of uniform sensitivity which, due to the provision of a set of additional sensor elements 402 on each sensor board 406 is multiplied by three to result in 36 planes of uniform sensitivity.

FIG. 5C shows, for the sensor arrangement 300 of FIG. 3 incorporating the sensor boards of FIG. 4B, the rejection of sensitivity to an interfering conductor as a function of distance from the centre of the volume V. The worst case is measured at a location halfway between the nulls in sensitivity of FIG. 5A.

Figure 6A:
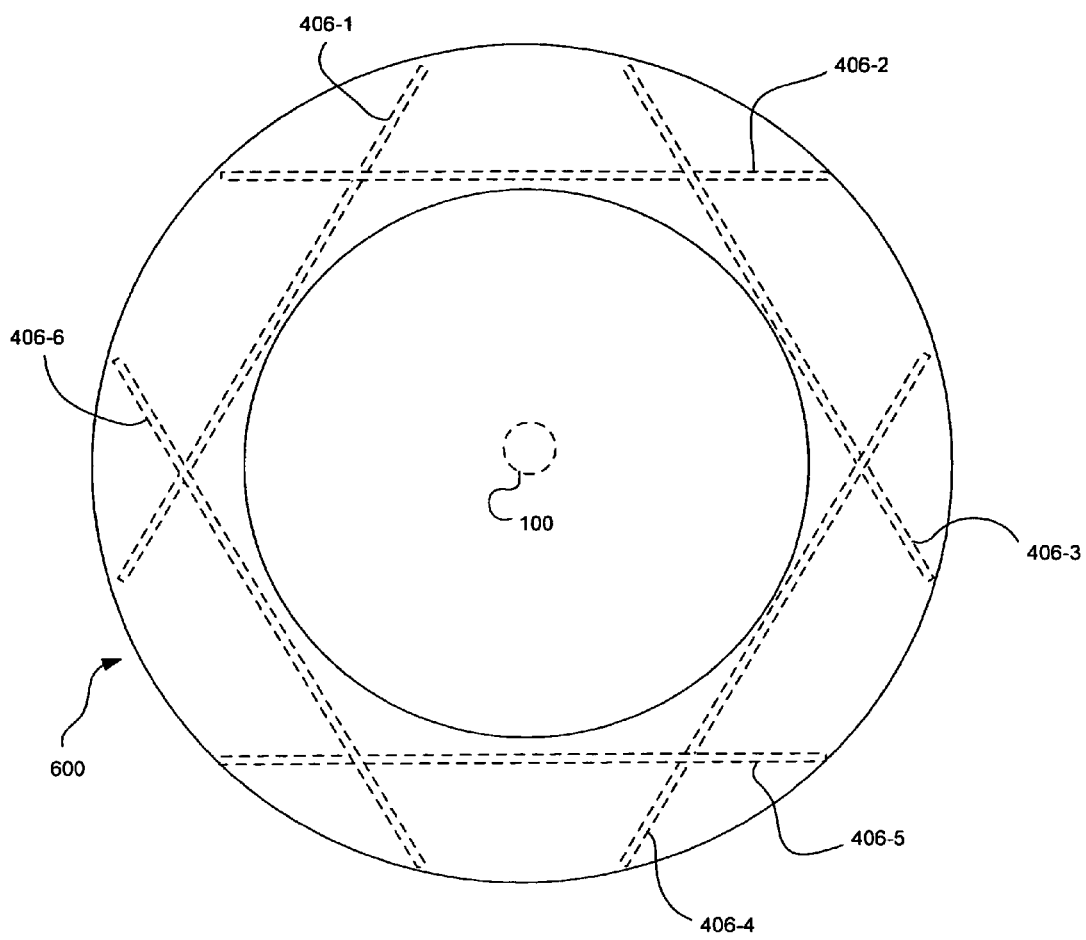
FIGS. 6A and 6B show a sensor device constructed according to the first embodiment of the invention.
Figure 6B:
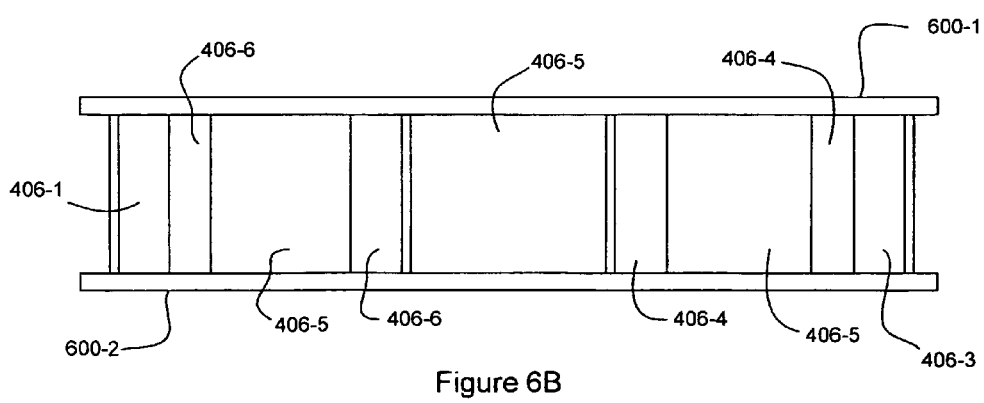

FIGS. 6A and 6B depict a schematic plan- and side-view respectively of a sensor device 600 according to the first embodiment of the invention. The sensor boards 406 are arranged to provide a hexagonal volume through which the primary conductor 100 extends. The sensor boards 406 are provided in a rigid frame 600.

The rigid frame comprises top and bottom portions 600-1, 600-2 which may be connected together for example using a plastic bolt(s) (not shown) which pass(es) from the top portion 600-1 to the bottom portion 600-2 of the frame 600. The frame may have slots (not shown) for supporting the edges of the sensor boards 406. Alternatively the edges of the sensor boards 406 may held against the inner surfaces of the top and bottom portions 600-1, 600-2 of the frame 600. According to alternative embodiments, the sensor boards 406 may be insert moulded. The sensor device of FIGS. 6A and 6A may also include signal conditioning electronics components (not shown) provided on the sensor boards.

Figure 7A:
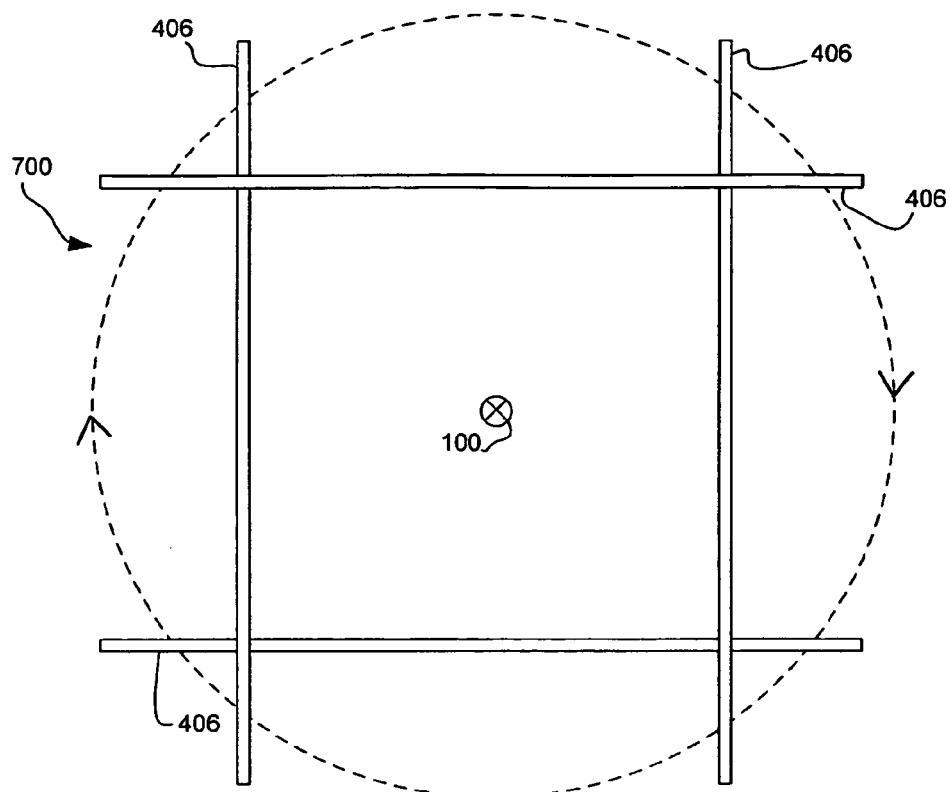
FIGS. 7A-C depict alternative embodiments of the invention.
Figure 7B:
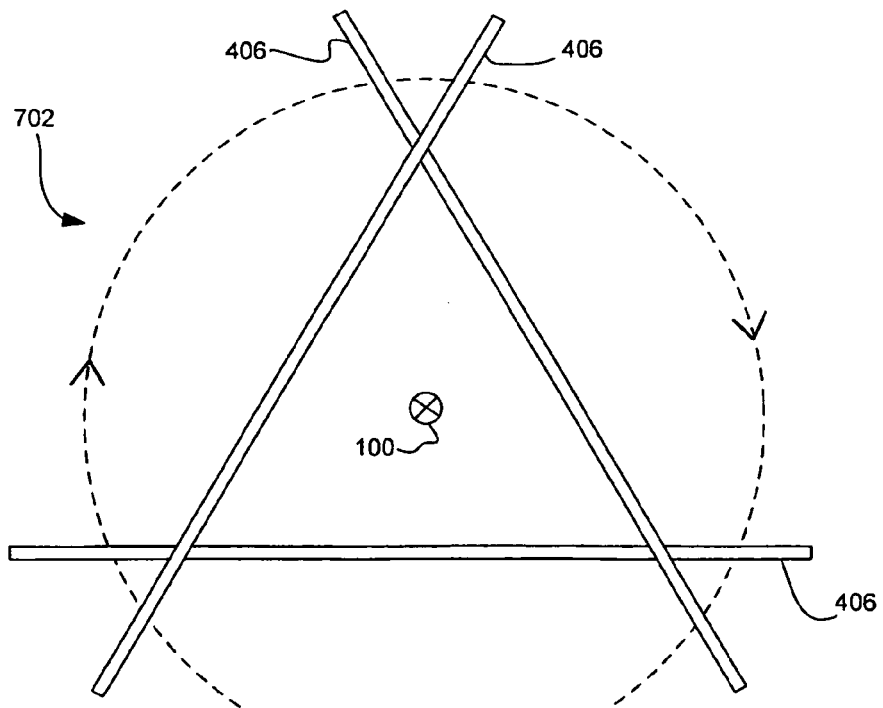
Figure 7C:
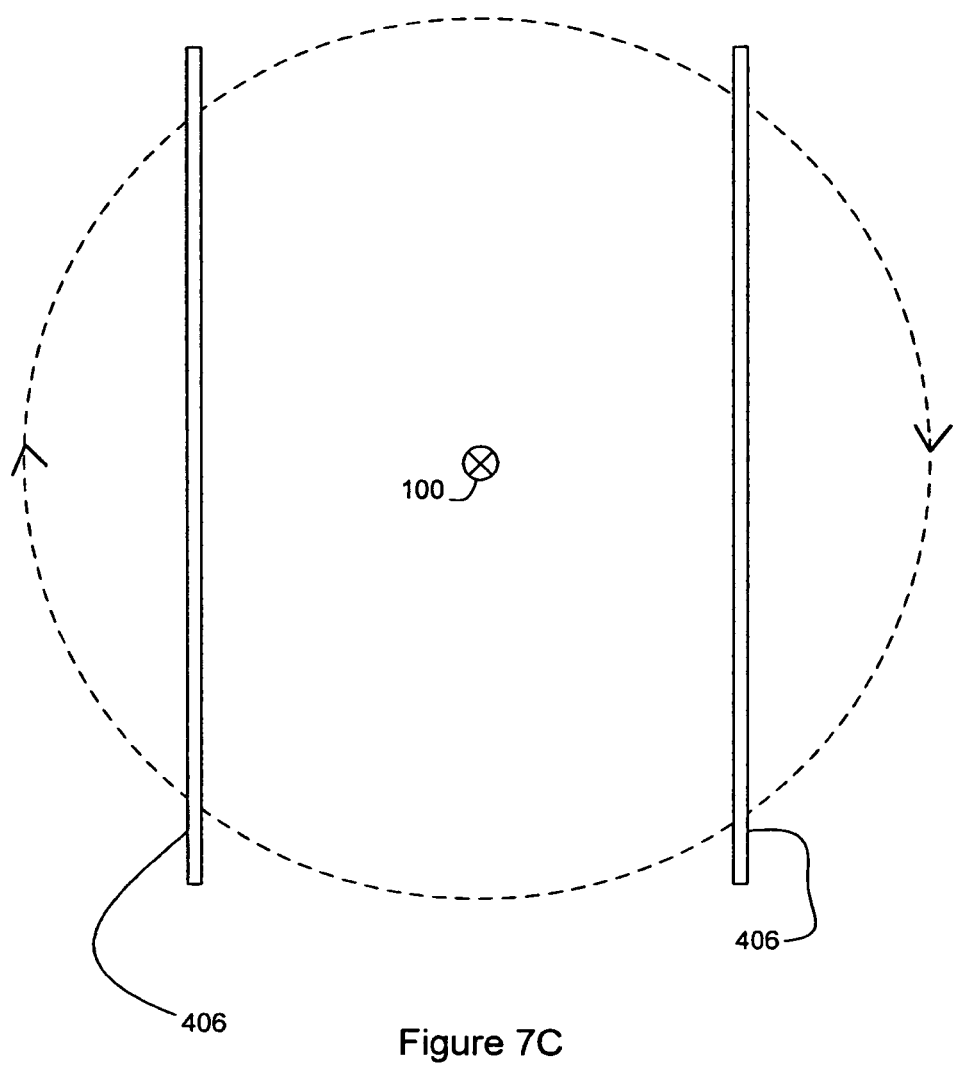

FIGS. 7A-C depict arrangements of sensor boards 406 according to alternative embodiments of the invention. The arrangement 700 of FIG. 7A includes four sensor boards 406 arranged so as to encompass a square volume around the primary conductor 100 and provided such that signals induced in the sensor elements (not shown) due to the circular magnetic field sum positively.

FIG. 7B shows a sensor arrangement 702 including three sensor boards 406 arranged such that they encompass a volume having triangular cross-section. As in the embodiments of FIGS. 3 and 7A, the sensor boards are arranged such that the signals generated in the sensor elements (not shown) due to a circular magnetic field sum positively.

FIG. 7C shows an arrangement according to an alternative embodiment including two sensor boards 406 arranged around a primary conductor 100.

The sensor boards of FIGS. 6 and 7 have been denoted as sensor boards 406 (i.e. those described with reference to FIG. 5B). However, it will be appreciated that they may instead comprise other types of sensor boards, for instance, but not limited to, those described with reference to FIGS. 2 and 4A.

In the above, the oppositely configured sensor elements are oppositely wound coils. These provide the function of giving an output signal of opposite sign for a uniform field. If the oppositely configured sensor elements are matched, for instance by having symmetrical configurations, they provide the function of giving an output signal of opposite sign and magnitude for a uniform field.

In other embodiments, the oppositely configured sensor elements are Hall effect sensors with different configurations, such that they give an output signal of opposite sign for a uniform field. In these cases, the sensors have planes of zero sensitivity to uniform magnetic fields, that are aligned similarly to the planes of the coils described above. In still further embodiments, electronic circuits are applied to sensor elements that have the same physical construction so as to cause them to be oppositely configured.

It will be understood by the skilled person that the any other suitable oppositely configured sensor elements could be used with the invention.

It should be realized that the foregoing embodiments should not be construed as limiting. Other variations and modifications will be apparent to persons skilled in the art upon reading the present application. Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features.

The invention claimed is:

1. A sensor configured for use in detecting a time-varying current in a conductor, the sensor comprising at least three planar substrates and a set of two sensor elements provided on each of the at least three planar substrates, wherein the two sensor elements of each set are configured such that a magnetic field passing through the two sensor elements in a first direction induces a positive signal in a first sensor element of the set and a negative signal in the second sensor element of the set;

wherein the at least three planar substrates are arranged in the form of a polygon around a central axis to define a sensing volume around the central axis and such that the plane of each of the at least three planar substrates does not intersect the central axis, each of the at least three planar substrates being arranged such that a normal to its plane at a point midway between the two sensor elements provided on a respective planar substrate and projected towards the central axis of the sensing volume lie on the same plane; and wherein the central axis is further defined by the time-varying current in the conductor.

2. The sensor of claim 1, wherein the sensor elements of each set are substantially symmetric about the point midway between the two sensor elements.

3. The sensor of claim 1, wherein the planar substrates are arranged such that the sensing volume has a substantially regular polygonal cross-section.

4. The sensor of claim 1, wherein a first of the planar substrates has one or more sets of two additional sensor elements provided thereon, each set of additional sensor elements being configured such that a magnetic field passing through the elements in a first direction induces a positive signal in a first additional sensor element of the set and a negative signal in the second additional sensor element of the set.

5. The sensor of claim 4, wherein:

at least one of four or more sensor elements on the first planar substrate is located on a first side of the first planar substrate, and at least three of the four or more sensor elements is located on a second side of the first planar substrate, the second side being closer to the central axis.

6. The sensor of claim 5, wherein the additional sensor elements are located on the second side of the planar substrate.

7. The sensor of claim 1, wherein each of the sensor elements comprises one or more turns of a conductor.

8. The sensor of claim 4, wherein each of the sensor elements comprises one or more turns of a conductor.

* * * * *